United States Patent
Hengl (10) Patent No.: US 11,493,546 B2
(45) Date of Patent: Nov. 8, 2022

(54) CONNECTION TEST DEVICE AND METHOD FOR CHECKING AN INTERMITTENT IMPEDANCE VARIATION

(71) Applicant: WEETECH GmbH, Wertheim (DE)

(72) Inventor: Rudi Hengl, Wertheim (DE)

(73) Assignee: WEETECH GMBH, Wertheim (DE)

( * ) Notice: Subject to any disclaimer, the term of this patent is extended or adjusted under 35 U.S.C. 154(b) by 3 days.

(21) Appl. No.: 17/173,072

(22) Filed: Feb. 10, 2021

(65) Prior Publication Data
US 2022/0187352 A1 Jun. 16, 2022

(30) Foreign Application Priority Data
Dec. 11, 2020 (DE) .......................... 102020133196.7

(51) Int. Cl.
| | |
|---|---|
| G01R 27/16 | (2006.01) |
| G01R 1/04 | (2006.01) |
| H01R 13/66 | (2006.01) |

(52) U.S. Cl.
CPC ........... *G01R 27/16* (2013.01); *G01R 1/0416* (2013.01); *H01R 13/6683* (2013.01); *H01R 2201/20* (2013.01)

(58) Field of Classification Search
CPC .. G01R 27/16; G01R 1/0416; H01R 13/6683; H01R 2201/20
See application file for complete search history.

(56) References Cited

U.S. PATENT DOCUMENTS

| | | | | |
|---|---|---|---|---|
| 5,239,535 A | * | 8/1993 | Born .................... | H04M 3/303 370/251 |
| 6,373,262 B1 | * | 4/2002 | Herring ................... | H04L 25/08 324/647 |

(Continued)

FOREIGN PATENT DOCUMENTS

| | | |
|---|---|---|
| CN | 103983884 A | 8/2014 |
| EP | 1 560 349 A1 | 8/2005 |

(Continued)

*Primary Examiner* — Akm Zakaria
(74) *Attorney, Agent, or Firm* — Lewis Roca Rothgerber Christie LLP (57) ABSTRACT

A method (200) and a connection test device (100; 300) for checking an intermittent impedance variation in a first and/or a second line (110; 302, 334) are described. The connection test device (100; 300) comprises a transmitter (102; 308) having a test signal generator (106) for generating a test signal and a first test point (108; 304) for connecting the first (110; 302) or the second line (334), wherein the test signal generator (106) supplies the test signal to the first (110; 302) or the second line (334) via the first test point (108; 304). The connection test device (100; 300) further comprises a first receiver (104; 310) having a second test point (112; 306, 336) for connecting the first (110; 302) or second line (334) and a receiver front end (114; 326, 328) which receives an incoming signal from the first (110; 302) or second line (334) via the second test point (112; 306, 336). The connection test device (100; 300) has, in addition, an evaluation logic (116), which is connected to the receiver front end (114; 326, 328) and which compares the input signal to a threshold value in order to identify an intermittent impedance variation in the first (110; 302) and/or the second line (334).

15 Claims, 5 Drawing Sheets

(56) References Cited

U.S. PATENT DOCUMENTS

| | | | |
|---|---|---|---|
| 2003/0086516 A1* | 5/2003 | Wagner | H04L 25/063 |
| | | | 375/350 |
| 2010/0099371 A1* | 4/2010 | Brummelman | H03J 7/04 |
| | | | 455/150.1 |
| 2010/0268507 A1 | 10/2010 | Sorenson | |
| 2012/0158089 A1* | 6/2012 | Bocek | A61N 1/37 |
| | | | 607/28 |
| 2014/0375355 A1* | 12/2014 | Saito | H03K 19/00361 |
| | | | 326/34 |
| 2016/0087448 A1* | 3/2016 | Takahashi | H02J 50/60 |
| | | | 307/104 |
| 2019/0033873 A1 | 1/2019 | Kadono et al. | |
| 2019/0257882 A1 | 8/2019 | Kelly et al. | |

FOREIGN PATENT DOCUMENTS

| | | |
|---|---|---|
| GB | 2529456 A | 2/2016 |
| GB | 2531268 A | 4/2016 |
| WO | WO 2020/125996 A1 | 6/2020 |

\* cited by examiner

CONNECTION TEST DEVICE AND METHOD FOR CHECKING AN INTERMITTENT IMPEDANCE VARIATION

CROSS-REFERENCE TO RELATED APPLICATION(S)

This application claims priority to German Patent Application Number 102020133196.7, filed on Dec. 11, 2020, the entire content of which is incorporated herein by reference.

TECHNICAL FIELD

The present invention relates to a connection test device and to a method for checking an intermittent impedance variation in a first and/or a second line.

PRIOR ART

Ready-made cable harnesses with connection plugs, in particular ones with many individual wires or wire networks, are usually checked with automatic connection testers during production and maintenance.

Standard connection testers check whether the connection in an individual wire or connections in wire networks comprising multiple individual wires is/are connected with low resistance to plug contacts of the connection plugs. Such connection testers are furthermore able to check whether the insulation between non-interconnected individual wires is high resistance.

These connection testers are usually controlled by a program. The program controls a test sequence and logs the test and the test results. The program is normally adapted to the cable harness to be tested and to connection data of the cable harness. The test sequence can sometimes be generated directly from schematics of the cable harnesses.

Numerous connections have to be checked in a cable harness with many individual wires. Checking and logging cable harnesses manually is subject to error and time-consuming and has therefore become uncommon.

A tester for detecting intermittent faults in lines and a simulation system for such intermittent faults is known from GB 2 529 456 A. The simulation system generates resistance variations in order to check multiple test channels of the tester.

A system for monitoring and displaying a state of a test device for intermittent faults is known from GB 2 531 268 A.

US 2010/268507 A1 describes a method and a device for detecting faults in multi-wire connections for electronic systems. The device can detect constant and intermittent faults; it comprises multiple ports that can be connected to different test points in the test object, a switching module with multiple multiplexers, and a multimeter, which can be connected to the various test points via the multiplexer.

A method and a device for checking a cable harness with a number of networks is known from WO 2020/125996 A1. The networks comprise a number of electrical modules. This known method comprises application of an AC voltage signal to the networks, measurement of the amperage and the voltage for each of the networks to which the AC voltage signal is applied, comparison of I-V curves of the respective networks generated on the basis of each measured amperage and each measured voltage with a default target I-V curve for the corresponding network, and output of an error message if one of the I-V curves generated on the basis of each measured amperage and each measured voltage deviates from the corresponding target I-V curve by more than a default threshold value.

OBJECT

The object of the invention is therefore that of providing a connection test device which simultaneously and therefore rapidly checks dynamic line faults in the form of intermittent impedance variations in individual lines as well as in cable harnesses with many lines, i.e., which shortens the test time, and which can also be produced economically, in particular without expensive precision measuring devices and without switching matrices or multiplexers.

DISCLOSURE OF THE INVENTION

According to the invention, provision is made for a connection test device for checking an intermittent impedance variation in a first and/or a second line according to Claim 1. The connection test device according to the invention comprises in particular a transmitter. The transmitter can comprise a test signal generator for generating a test signal and a first test point for connecting the first or second line, wherein the test signal generator can supply the test signal to the first or second line via the first test point. The connection test device according to the invention furthermore comprises in particular a first receiver. The receiver essentially comprises a second test point for connecting the first or a second line, and a receiver front end that receives an incoming signal from the first or second line via the second test point. The connection test device according to the invention also generally comprises an evaluation logic, which is connected to the receiver front end and which can compare the input signal to a threshold value in order to identify an intermittent impedance variation in the first and/or the second line.

The term "check" should essentially include the meaning of verifying that the first line is fault-free. Freedom from faults can be expressed as "present" or "absent" or more specifically as "intermittent impedance variation present" or "intermittent impedance variation absent" or still more specially as "break present" or "break absent" or "short circuit present" or "short circuit absent". Unlike the term "measure", the term "check" may not include the meaning that an exact measurement value is determined. The term "check" can also include the meaning of "test" or "determine."

The term "connected" can include the meaning "coupled". In particular, "connected" is understood to mean "electrically connected", "electroconductively connected" or "electrically coupled". Two connected elements of the invention, for instance the evaluation logic and the receiver front end, should in particular also be considered as interconnected if there are interposed elements such as plugs, switches, filters or the like.

The term "impedance" should include in particular the meanings "AC resistance"; $Z=R+jX$, wherein R is a real component of the impedance and X is an imaginary component of the impedance; $Z=|Z|*e^{j\varphi}$, wherein $|Z|$ is the apparent resistance and $\varphi$ is a phase shift angle with values between $-90°$ and $90°$; "apparent resistance" and/or "real resistance".

The term "intermittent" can include the meanings "intermittent", "diminishing", "with interruption", "occurring in time intervals" and/or "passing".

The first and the second lines or the first wire and the second wire each essentially comprise a first line end and a second line end. The first and the second lines can each comprise a cable network, in which multiple first and/or second line ends are present. The first and the second lines can comprise plug-in connectors, wherein a first plug-in connector is connected in particular to the first line end and/or a second plug-in connector is connected to the second line end. The first test point can be connected to the first line end or to the first plug-in connector of the first or second line. The second test point can be connected to the second line end or to the second plug-in connector of the first or second line. The first and the second lines each generally have an impedance between the first and second line ends. Furthermore, the first and second lines can each comprise an insulating sheath. Lines with insulating sheaths can be designated as cables. Together, multiple cables can form a cable harness.

The impedance can change due to various causes. The causes include a faulty soldering point, a cold soldering point, a faulty crimp connection on one of the plug-in connectors, non-insulated points of the first line contacting a second line, cable breakage, damage to the insulation, a plug-in connection that is not completely plugged in, a loose contact, etc. Impedance variations arising in the event of specific environmental influences acting on the the first line are generally designated as temporary, intermittent or dynamic. Examples of such specific environmental influences include: low temperature (e.g., below 77.4 K), heat, light, humidity, water, condensation, corrosion, mechanical stress (vibrations, blows, jarring, acceleration), maritime climate, sand, dust. A test bench, for example, can be used to subject the first line and/or the second line to an artificially generated environmental influence in order to check for impedance variations during the same. For example, the connection test device according to the invention can thus be used for simultaneously checking the impedance of all lines of a cable harness subjected to vibrations. The connection test device can comprise a computer, in particular one that is connected to the evaluation logic. The computer can receive data on the nature and/or intensity of the artificially generated environmental influence. According to a further preferred embodiment, the computer analyzes in particular impedance variation with respect to the artificially generated environmental influence. The computer can thus determine correlations between the artificially generated environmental influence and the impedance variation.

The test signal is essentially supplied at the first line end and converted to an input signal at the second line end by the impedance of the first wire.

Standard test devices usually have only one measuring device, which is connected sequentially to multiple lines via a switching matrix. The connection test device according to the invention can comprise multiple transmitters and multiple receivers for checking multiple lines in parallel or at the same time and thus quickly.

Standard test devices usually rely on a precise and expensive multimeter or impedance measuring instrument. The connection test device according to the invention can be produced, either wholly or in part, as an IC, for instance as a FPGA (field programmable gate array) or an ASIC (application-specific integrated circuit). The connection test device according to the invention can thus be produced economically and can test many lines quickly.

According to a preferred embodiment, the receiver front end comprises an RC element. The RC element can pick up an AC voltage signal from the second test point, wherein the AC voltage signal essentially forms the input signal. R generally stands for an ohmic resistor or a terminating impedance and C stands for a capacitor. The resistor or the terminating impedance and the capacitor are in particular connected in parallel. A current flowing to the second test point and through the resistor elicits in particular a voltage drop on the resistor. The capacitor blocks a DC voltage component in the voltage drop and essentially only transfers an AC component, i.e., the input signal, of the voltage drop to the evaluation logic. As an alternative, a transducer or transformer can be used instead of or in addition to the RC element.

In a further development of the invention, the evaluation logic can comprise at least a first comparator which compares the input signal with a settable first threshold value. A shortfall of the first threshold value may indicate a break in the first or second line. More precisely, the first comparator can compare the AC voltage signal to a voltage threshold value. If the AC voltage signal falls short of a minimum voltage, this essentially means that less current than expected is flowing through the first or second wire and the resistor. This can mean a temporary rise in impedance in the first or second line, i.e., a break in the first or second line. The first comparator preferably outputs a binary comparison result. The binary comparison result is, for example, 0 for the case in which the AC voltage signal exceeds the threshold value. The binary comparison result is, for example, 1 for the case in which the AC voltage signal is below the threshold value. The comparison result can be stored in a memory. The memory can store multiple comparison results in sequence. The evaluation logic comprises a clock. The clock can be configured as a continuous counter. The multiple comparison results can each be stored in the memory with a time stamp generated by the clock. An adder can add up, i.e. count, multiple comparison results and store them in the memory. The FPGA can comprise the memory and the adder.

It is also possible to detect a static fault in the first or second line, distinguish it from a dynamic fault, and count it as such, for example if the fault still exists, but a specific programmable time has elapsed since a previous signal change.

According to a preferred design, the test signal comprises in particular a DC voltage. The first wire or the second wire generally has a primary line constant or a line surge impedance or an impedance. The impedance can vary due to different causes and/or environmental influences. The DC voltage imposed on the first or second line generally induces a DC current in the wire. However, should a temporary impedance variation occur during the imposed DC voltage, this essentially leads to a current variation, which can be evaluated as AC components or as non-DC components by the receiver.

In an advantageous further development, the test signal generator comprises an identification signal generator which generates a unique identification signal. The identification signal can be added to or used to modulate the DC voltage and form the test signal. The identification signal preferably occurs in superimposed form in the incoming signal. The receiver can decode the identification signal and assign it to the test signal of the test signal generator or transmitter. If the connection test device according to the invention comprises multiple transmitters and receivers for checking multiple lines, the receivers can use the identification signal to assign the incoming signals to the respective test signals of specific test signal generators or transmitters.

In another embodiment, the test signal generator comprises in particular a mixer and an oscillator, wherein the mixer mixes the identification signal with a carrier signal generated by the oscillator to form an in particular BPSK-modulated high frequency signal. In particular, the test signal generator comprises a baseband generator for generating a unique identification code; a non-return-to-zero (NRZ) encoder, which is connected to the baseband generator and which encodes the unique identification code in an AC signal or NRZ signal; the mixer, which is connected to the NRZ encoder and the oscillator and which receives the NRZ signal and the carrier signal and mixes both to form the high frequency signal; an adder, which sums the DC voltage and the high frequency signal, a first power amplifier, which amplifies the high frequency signal, and a first switch, which can selectively connect the first power amplifier to the first test point and which selectively conducts the amplified high frequency signal to the first test point, wherein the amplified high frequency signal forms the test signal.

The test signal generator can output the identification code to the first test point in an endless loop.

In addition, the test signal generator comprises in particular a second switch, which deactivates the high frequency signal and/or the baseband generator so that the test signal generator generates only the DC voltage signal with the superimposed identification signal or only the DC voltage signal, wherein the DC voltage signal with the superimposed identification signal or the DC voltage signal is amplified by means of the first power amplifier and can be selectively output as a test signal to the first test point via the first switch. The DC voltage signal is particularly suitable for checking whether there is a break or dynamic impedance rise in the first or second line.

According to a further development, the receiver comprises in particular an identification signal demodulator. The identification signal demodulator can comprise a downconverter, which receives the input signal and the carrier signal and downconverts the input signal by the frequency of the carrier signal to a downconverter output signal; an integrator, which is connected to the downconverter, receives the downconverter output signal, integrates it over a bit period and outputs it as an integrator output signal; a threshold value discriminator, which is connected to the integrator, receives the integrator output signal, compares it to a discrimination threshold value in a bit center and outputs a digital signal, and a baseband analysis unit, which is connected to the threshold value discriminator, receives the digital signal, and analyzes whether the digital signal contains an identification code, and if so which one. The baseband analysis unit can use the identification code to assign the incoming signal uniquely to the test signal of the transmitter, or in the case of multiple transmitters, to the test signal of a specific one of the multiple transmitters.

The receiver can further comprise a filter, which is connected between the RC element and the evaluation logic. The filter can attenuate the identification signal in the incoming signal. The filter comprises, for example, a high-pass filter, a band-pass filter or baseband filter. The attenuation can prevent the identification signal from reaching the evaluation logic and leading to an erroneous threshold value comparison there. The filter can be connected in parallel to a bypass path. A second switch can be connected between this parallel circuit and the RC element. The second switch can selectively switch the incoming signal to the filter or to the bypass path around the filter. Without filtering, the evaluation logic is able to maintain the input signal with maximum bandwidth. Maximum bandwidth may be useful in cases in which a high frequency signal is not superimposed on the input signal.

A further power amplifier, which amplifies the input signal or the filtered input signal and supplies it to the evaluation logic as an amplified input signal, can be connected between the parallel circuit consisting of the bypass path and the filter and the evaluation logic.

The identification signal is modulated in particular by means of a digital modulation method, for example phase-shift keying (PSK), BPSK or 2-PSK. The transmitter can comprise in particular a BPSK modulator, which generates the identification signal, and the receiver can comprise a BPSK demodulator, which decodes the identification signal. BPSK modulators and BPSK demodulators are generally easy to produce, since they can be implemented in a FPGA and expensive analog-to-digital converters or digital-to-analog converters are normally not required for an analog signal conversion.

In a further design, it is possible to select a frequency of the carrier signal as a function of a length of the first or second line. In particular, the frequency of the carrier signal is inversely proportional to the length of the first or second line. More preferably, the following applies:

$$\lambda = VK \cdot \frac{c_0}{f_c} \gg 2 \cdot L$$

wherein
$\lambda$: wavelength of the frequency of the carrier signal
VK: shortening factor of the first line, e.g., 0.66
$c_0$: speed of light in a vacuum
$f_c$: frequency of the carrier signal
L: maximum length of the first line Essentially, this results in the first line, to which a high frequency signal is applied, not acting as an antenna and irradiating into the second line or into the connection test device.

According to a preferred further development, the test signal generator can add the DC voltage to the high frequency signal and form the test signal therefrom. This essentially gives rise to a modulated DC voltage. The modulated DC voltage can be amplified using the power amplifier and output to the first line via the first test point.

Further preference is given to the transmitter comprising the first switch, which can selectively decouple the test signal generator from the first test point. In particular, the transmitter and the receiver are completely or partially implemented in a chip and together, they form a transceiver. The term test point can include the meaning of a connection interface for a line end and/or it can be understood as synonymous with the entire transceiver. The first switch can control whether the transceiver is configured as a combination transmitter and receiver or as a receiver. The connection test device comprises, for example, at least two transceivers, one being configured as a transmitter and the other being configured as a receiver. Preferably, it is possible to implement 10, 100, 1,000, 10.000 or 100,000 transceivers in the chip in order to be able to test multiple lines in parallel or simultaneously.

According to a preferred further development, the connection test device can comprise a second receiver for testing the first and/or the second line. Particularly in a cable harness, a temporary short circuit can occur between two cables or lines of the cable harness due to the various causes and the effects of environmental influences. Temporary short circuits can also occur in plug-in connectors on the cable harness. In addition to temporary breaks, the connection test device according to the invention can also identify temporary short circuits. To this end, the evaluation logic comprises in particular a second comparator, which compares the input signal to a second threshold value, wherein an exceeding of the second threshold value can indicate that there is a short circuit between the first and the second line. The first threshold value is preferably less than the second threshold value. The first and second threshold values essentially form a lower and an upper threshold voltage. A difference between the first and the second threshold voltage in conjunction with an input gain can define the response sensitivity of the comparators. The response sensitivity can define a measurable impedance variation range. A nominal impedance of the first and/or the second line preferably lies midway between the first and the second threshold values. The threshold voltages are settable and essentially comprise a target value and a tolerance value. The evaluation logic can use the known resistance in the RC element and the lower and upper threshold voltages to identify a rise in the impedance of the first line above an upper impedance limit or a decrease in the impedance of the first line below a lower impedance limit. In the case of a temporary short circuit in the cable harness, a difference-signal level generally arises between the first and the second line, which depending on the polarity induces a current rise on the resistor of the first receiver or on a resistor of the second receiver. The current rise induces a voltage rise, which in turn can lead to an exceeding of the upper threshold voltage. By means of the identification signal, the receiver can identify the transmitter from which it originates. If it is known which transmitter is connected to which cable of the cable harness, it is possible to determine which cables are temporarily short-circuited. The BPSK modulation of the high frequency signal is particularly advantageous in terms of checking for a short circuit between the first and the second lines. The BPSK modulation avoids, for example, a signal level equality on the first and second lines and also the equality of a signal level distribution over the first and second lines. A detectable difference signal level is thus able to form if the signal levels and the signal level distribution over the first and second lines are not equal.

A method according to the invention for checking for an intermittent impedance variation in a first and/or second line preferably comprising the steps: transmission of a test signal by means of a transmitter via a first test point to which a first wire end of the first or second line can be connected; subjection of the first or second line to environmental influences which alter the impedance of the first and/or second line; reception of an input signal with a receiver via a second test point to which a second line end of the first or second line can be connected; conversion of the input signal to a voltage signal with a receiver front end, filtering of the input signal with the receiver front end to obtain an AC component of the input signal; comparison of the AC component to a threshold value using an evaluation logic in order to identify an intermittent impedance variation in the first and/or second line.

Advantageous further developments of the invention are specified in the subordinate claims and described in the description.

BRIEF DESCRIPTION OF THE DRAWINGS

Exemplary embodiments of the invention shall be explained in more detail, with reference to the drawings and the following description. Therein.

EMBODIMENTS OF THE INVENTION

Figure 1:
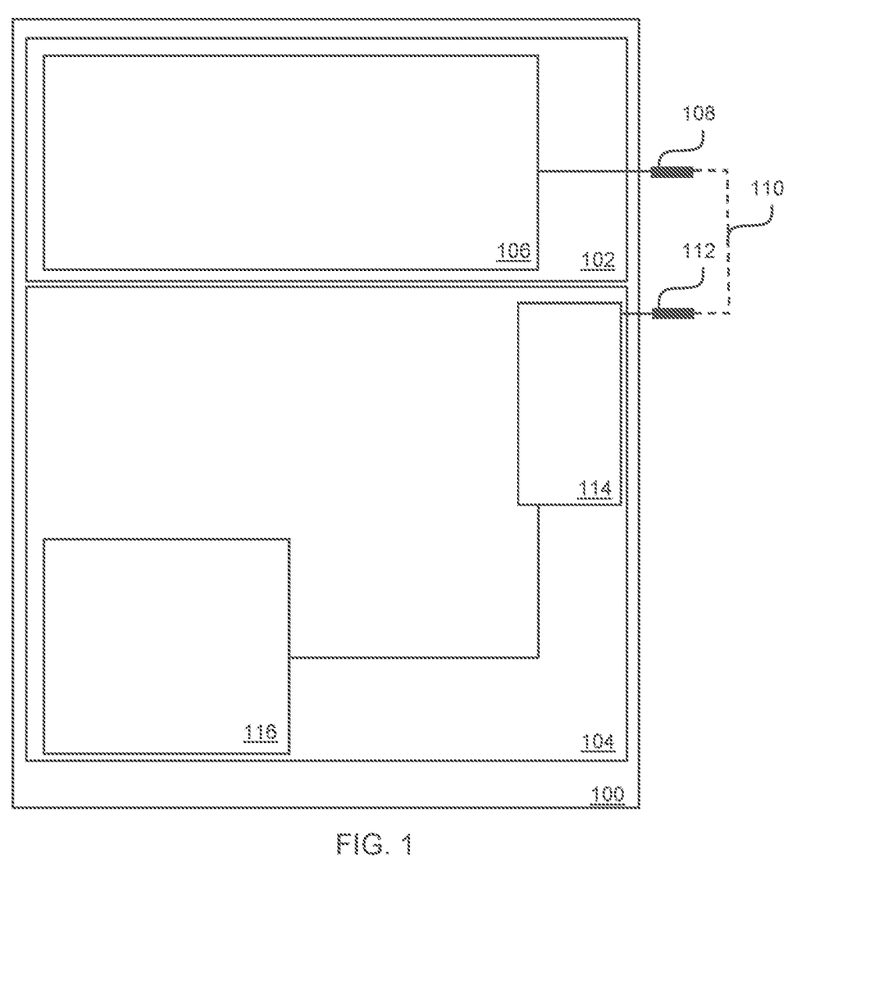
FIG. 1 shows a block diagram of a connection test device according to an exemplary embodiment of the invention.

A connection test device 100 according to an exemplary embodiment of the invention is shown in FIG. 1. The connection test device 100 comprises a transmitter 102 and a receiver 104. The transmitter 102 comprises a test signal generator 106, which generates a test signal. The transmitter 102 further comprises a first test point 108 for connecting a first line end of a first line 110. The test signal generator 106 supplies the test signal to the first line 110 via the first test point 108. The transmitter 102 in conjunction with a further receiver can form a transceiver or a test point. The receiver 104 comprises a second test point 112 for connecting a second line end of the first line 110. The receiver 104 further comprises a receiver front end 114, which receives an incoming signal from the first line via the second test point 112, and an evaluation logic 116, which is connected to the receiver front end 114. The receiver 104 in conjunction with a further transmitter can form a further transceiver or a further test point.

Figure 2:
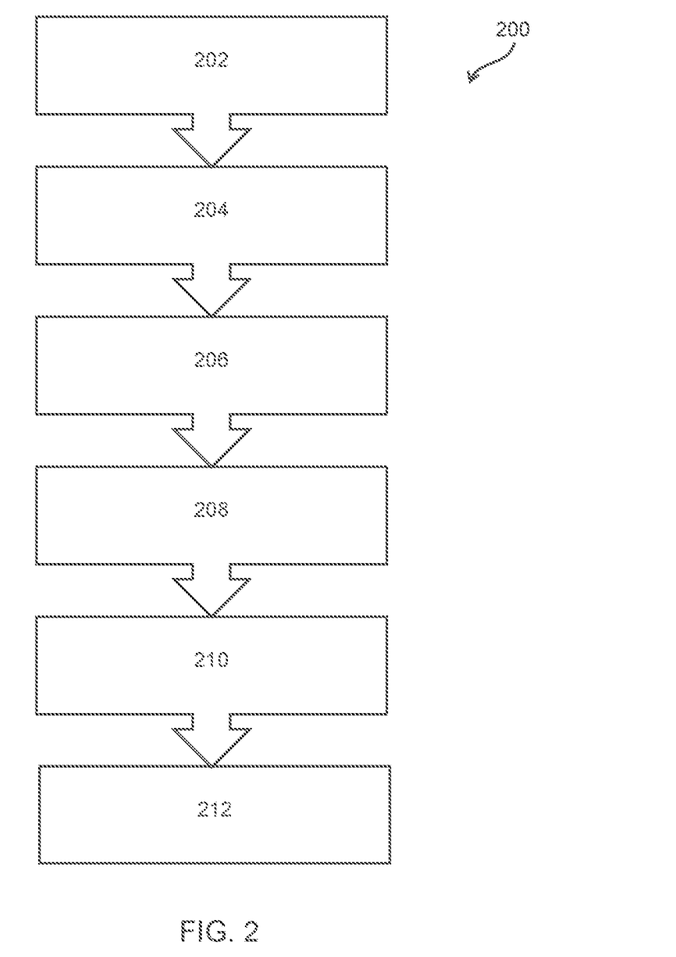
FIG. 2 shows a test method according to an exemplary embodiment of the invention.

A test method 200 for checking an intermittent impedance variation in a first and/or second line is shown in FIG. 2. In a first step 202, a transmitter transmits a test signal into a first line end of the first or second line. In a second step 204, the first wire and/or second wire is/are exposed to environmental influences, e.g., low temperature (below 77.4 K), heat, light, humidity, water, condensation, corrosion, mechanical stress (vibrations, blows, jarring, acceleration), maritime climate, sand and/or dust. The environmental influences lead to a dynamic variation of an impedance of the first line and/or the second line. In a third step 206, a receiver receives an input current signal, which is based on the DC voltage signal altered by impedance variation, from a second line end end of the first or second line. In a fourth step 208, a receiver front end converts the input current signal to an input voltage. In a fifth step 210, the receiver front end filters an AC portion from the input voltage. In a sixth step 212, an evaluation logic compares the AC portion to a settable first threshold voltage, which is composed of a maximum voltage and a tolerance value, wherein a shortfall of the first threshold voltage indicates an intermittent impedance rise, i.e., a dynamic break of the first line. With the method 200, the connection test device 100 can easily and quickly check for dynamic line faults in the form of intermittent impedance variations in individual lines as well as in cable harnesses with many lines without using an expensive precision measuring device.

Figure 3A:
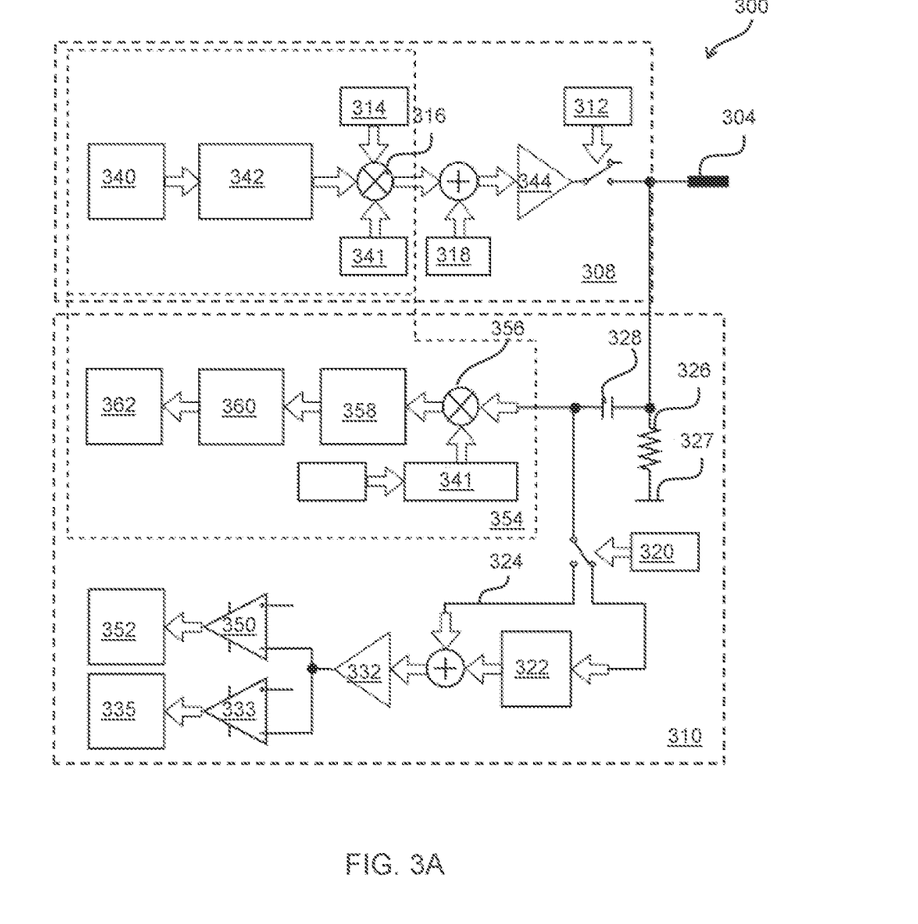
FIG. 3A shows a block diagram of a connection test device according to a further exemplary embodiment of the invention.
Figure 3B:
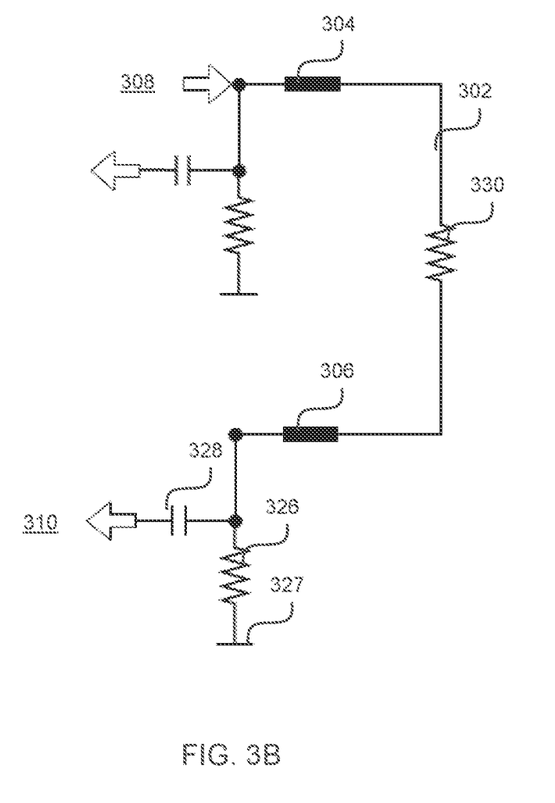
FIG. 3B shows an application of the connection test device according to the further exemplary embodiment of the invention.

A connection test device 300 according to a further exemplary embodiment of the invention is shown in FIG. 3A. The connection test device 300 checks whether an impedance rise occurs in a first individual wire 302 to be tested during a test, see FIG. 3B. The first individual wire 302 to be tested is part of a cable harness and is connected to at least two test points 304, 306 of the connection test device 300. The first test point 304 is configured as a transmitter 308 and transmits a test signal to the first test point 304. The second test point 306, see FIG. 3B, is configured as a receiver 310 in that its own transmission signal is switched off by means of a transceiver switch 312, and it receives an incoming signal from the first individual wire 302 to be tested. A mixer 316 in the transmitter 308 is controlled by means of a high frequency switch in such a way that it outputs a DC voltage signal generated by a DC voltage source 318. A power driver 344 amplifies the DC voltage signal and supplies it to the first test point 304 via the transceiver switch 312. The receiver 310 comprises a bypass switch 320, a parallel circuit with a baseband filter 322 and a bypass line 324, wherein the bypass switch 320 is set in such a way that the baseband filter 322 is bypassed. Accordingly, the receiver 310 receives an input voltage signal from the first individual wire 302 to be tested with maximum bandwidth. A current exiting the first individual wire 302 flows via a measuring resistor or a terminating impedance 326 to a supply voltage potential 327 or to ground and converts the current to the input voltage signal, which is separated from a DC voltage component via a capacitor 328 connected in parallel to the measuring resistor. The signal passing through the capacitor 328 represents the AC portion of the input voltage signal. A rise in a line impedance 330 of the first individual wire 302 results in a reduction of the current and thus of the input voltage signal. This input voltage signal or the AC component thereof is amplified with an input amplifier 322 and supplied to a cut-off comparator 333, which compares the amplified AC component to a settable cut-off voltage level. If the amplified AC component falls below the cut-off voltage level, a binary result signal is output to an analysis unit 335, wherein a 1 stands for a break in the individual line 302 and a 0 for no break in the individual line 302. A change of this binary signal is counted as a dynamic stuck-open fault in a FPGA (field programmable gate array). According to a further exemplary embodiment, the connection test device 300 can also distinguish and count static line faults, wherein the line fault still exists, but a specific programmable time has elapsed since a previous change of the binary signal.

Figure 3C:
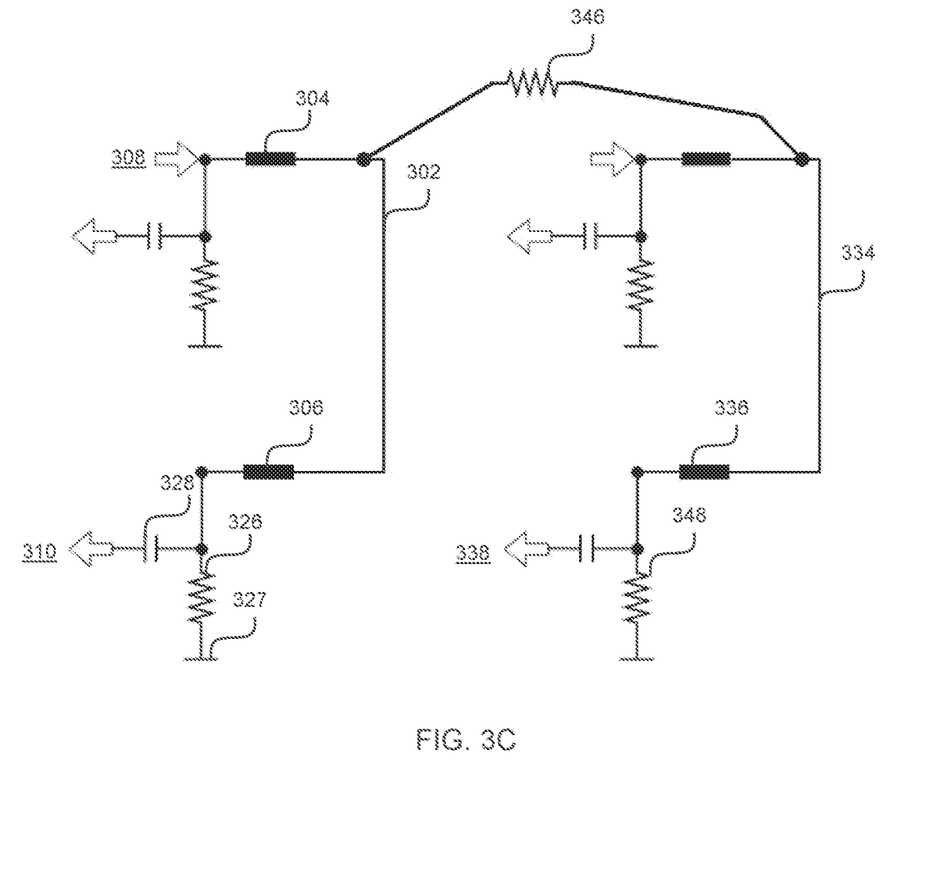
FIG. 3C shows an application of the connection test device according to the further exemplary embodiment of the invention.

According to a further exemplary embodiment of the invention, the connection test device 300 can detect a dynamic short circuit between the first and a second individual wire 334. The first individual wire 302 to be tested is connected to the first and second test points 304, 306 or to transceivers, as described above. The term test point can thus include the meaning of a connection interface for a line end and/or can be understood as synonymous with the entire transceiver. In order to be able to check for a short circuit, at least the second individual wire 334 must be connected to a third test point 336 of a second receiver 338 or of a further transceiver comprising the receiver 338. The third test point 336 is therefore configured either as a pure receiver 338 or as a transceiver. Each transmitter has a unique address, the latter is part of a baseband signal 340 generated in the transmitter. An FPGA generates this baseband signal 340 and supplies it to a NRZ (non-return-to-zero) encoder 342. Accordingly, the NRZ encoder 342 encodes ones and zeros of the baseband signal 340 in +1 for the logic 1 and −1 for the logic 0. An NRZ signal generated by the NRZ encoder 342 is multiplied in the mixer 316 with a carrier signal of an oscillator 341. A signal arising in this manner is BPSK-modulated (BPSK=binary phase shift keying). This BPSK-modulated signal, also known as a frame, is needed for the detection of an impermissible electrical connection, i.e. short circuit, of two individual wires. If only impedance rises are detected, the BPSK signal can be deactivated via the high frequency switch 314 so that the transmitter 308 generates a DC voltage signal. If the high frequency switch 314 is activated, the transmitter 308 constantly outputs the BPSK-modulated signal in a sequential manner as a continuous data stream.

A frequency $f_c$ of the carrier signal is selected such that:

$$\lambda = 0{,}66 \cdot \frac{c_0}{f_c} \gg 2 \cdot L$$

wherein
$\lambda$: wavelength of the frequency of the carrier signal
$c_0$: speed of light in a vacuum
$f_c$: frequency of the carrier signal
L: maximum length of the individual line By means of the ratio of carrier frequency to line length, it is ensured that signal levels within a frame of the lines 302, 334 connected to the test points 304, 306, 336 differ.

At the first test point 304, a logic 1 is defined as:
$s_n(t) = A \cdot \cos(2\pi f_c t) + s_2$ At the first test point 304, a logic 0 is defined as:
$s_n(t) = A \cdot \cos(2\pi f_c t + \pi) + s_2$ wherein:
A: maximum amplitude of the carrier signal
$f_c$: frequency of the carrier signal
$s_2$: DC voltage signal of the DC voltage source 18, which acts as a DC voltage offset The DC voltage offset gives rise to a modulated DC voltage, which is supplied to the first test point 304 via the power driver 344 and the activated transceiver switch 312.

If the first test point 304 is not needed as a transmitter but instead as a receiver, for instance for troubleshooting if two transmitters are feeding into a circuit during a sustained short circuit, the transceiver switch 312 turns off the modulated DC voltage signal or the transmission signal.

If there is a conductive connection 346 or short circuit between the first and second individual wires 302, 334, a current flow occurs between the individual lines 302, 334 as a result of the level difference. This leads to a brief level increase, which is reflected in the input signal, on the terminating impedances 326 or the terminating impedance 348, depending on which one a lower signal level resides. The bypass switch 320 upstream of the baseband filter 322 is deactivated, i.e., the input signal is routed through the filter and spectral components from the baseband are attenuated so that they are not, or else only temporarily, evaluated by the cut-off comparator 333 or by a short circuit comparator 350. The BPSK signal generated by the transceiver itself can be removed in a digital filter in the receiver thereof, wherein the time and expected address are known to the filter. Temporarily means that a residual active comparator time suffices for detecting foreign spectral components from the second wire. The filtered input signal is supplied to the cut-off comparator for comparison to the settable cut-off voltage level and to the short circuit comparator 350 for comparison to a settable cut-off voltage level. If the cut-off voltage level is exceeded, a binary result signal is output to an analysis unit 352, wherein a 1 stands for no short circuit between the first and second individual lines 302, 334 and a 0 stands for a short circuit between the first and second individual lines 302, 334. This binary result signal is counted as a dynamic short circuit fault in the FPGA. The first and second receivers 310, 338 each have a BPSK demodulator 354. The BPSK demodulator 354 comprises a downconverter 356, which receives the input signal and the carrier signal and reduces the input signal by the frequency of the carrier signal to a downconverter output signal, an integrator 358, which is connected to the downconverter 356, receives the downconverter output signal, integrates it over a bit period and outputs it as an integrator output signal; a threshold value discriminator 360, which is connected to the integrator 358, receives the integrator output signal, compares it to a discrimination threshold in a bit center and outputs a digital signal; and a baseband analysis unit 362, which is connected to the threshold value discriminator 360, receives the digital signal, and evaluates whether an address, and if so which address, is contained in the digital signal. The BPSK demodulator 354 can use the address to assign the incoming signal uniquely to the transmission signal of the transmitter or, in the case of multiple transmitters, to the transmission signal of a specific one of the multiple transmitters.

LIST OF REFERENCE NUMERALS

100 Connection test device
102 Transmitter
104 Receiver
106 Test signal generator
108 First test point
110 First line
112 Second test point
114 Receiver front end
116 Evaluation logic
200 Test method
202, 204, Steps
206, 208,
210, 212
300 Connection test device
302 First individual wire
304 First test point
306 Second test point
308 Transmitter
310 Receiver
312 Transceiver switch
314 High frequency switch
316 Mixer
318 DC voltage source
320 Bypass switch
322 Baseband filter
324 Bypass line
326 Measuring resistor
327 Supply voltage potential
328 Capacitor
330 Line impedance
332 Input amplifier
333 Cut-off comparator
334 Second individual wire
335 Analysis unit
336 Third test point
338 Second receiver
340 Baseband signal
341 Oscillator
342 NRZ encoder
344 Power driver
346 Conductive connection
348 Terminating impedance
350 Short circuit comparator
352 Analysis unit
354 BPSK demodulator
356 Downconverter
358 Integrator
360 Threshold value discriminator
362 Baseband analysis unit

The invention claimed is:

1. A connection test device for checking an intermittent impedance variation in a first and/or second line, comprising:
 a transmitter having
  a test signal generator for generating a test signal and
  a first test point for connecting the first or second line, wherein the test signal generator supplies the test signal via the first test point to the first or second line, and a first receiver having
  a second test point for connecting the first or second line and
  a receiver front end, which receives an incoming input signal from the first or second line via the second test point, and
  an evaluation logic, which is connected to the receiver front end and which compares the input signal to a threshold value in order to identify an intermittent impedance variation in the first and/or second line,
 wherein the transmitter and the first receiver form a transceiver and wherein the connection test device comprises at least two transceivers to test multiple lines in parallel.

2. The connection test device according to claim 1, wherein the receiver front end comprises a RC element, which picks up an AC voltage signal from the second test point, which forms the input signal.

3. The connection test device according to claim 1, wherein the evaluation logic comprises at least a first comparator, which compares the input signal to a settable first threshold value, wherein a shortfall of the first threshold value indicates a break in the first or second line.

4. The connection test device according to claim 1, wherein the test signal comprises a DC voltage.

5. The connection test device according to claim 1, wherein the test signal generator comprises an identification signal generator which generates a unique identification signal.

6. The connection test device according to claim 5, wherein the test signal generator comprises a mixer (316) and an oscillator, wherein the mixer mixes the identification signal with a carrier signal generated by the oscillator to form an in particular BPSK-modulated high frequency signal.

7. The connection test device according to claim 5, wherein the receiver comprises an identification signal demodulator.

8. The connection test device according to claim 5, wherein the receiver comprises a filter (322) which is connected between the RC element and the evaluation logic.

9. The connection test device according to claim 6, wherein a frequency of a carrier signal is selected as a function of a length of the first or second line.

10. The connection test device according to claim 6, wherein the test signal generator sums the high frequency signal with a DC voltage and forms the test signal therefrom.

11. The connection test device according to claim 1, wherein the transmitter comprises a first switch, which selectively decouples the test signal generator from the first test point.

12. The connection test device according to claim 1, wherein the connection test device comprises a second receiver for testing the first and/or second line.

13. The connection test device according to claim 1, wherein the evaluation logic comprises a second comparator, which compares the input signal to a second threshold value, wherein an exceeding of the second threshold value indicates a short circuit between the first and second lines.

14. A method for checking an intermittent impedance variation in a first and/or second line, which comprises the following steps:
- transmission of a test signal by means of a transmitter into a first line end of the first or second line;
- subjection of the first or second line to environmental influences which alter an impedance of the first and/or the second line;
- reception of an input signal with a receiver from a second line end of the first or second line;
- conversion of the input signal with a receiver front end into a voltage signal;
- filtering of the voltage signal with the receiver front end to obtain an AC portion of the input signal;
- comparison of the AC portion to a threshold value by means of an evaluation logic, in order to identify an intermittent impedance variation in the first and/or second line therefrom,
- wherein the transmitter and the receiver form a transceiver and wherein at least two transceivers are comprised in a connection test device to test multiple lines in parallel.

15. A connection test device for checking an intermittent impedance variation in a first and/or second line, comprising:
- a transmitter having
  - a test signal generator for generating a test signal and
  - a first test point for connecting the first or second line, wherein the test signal generator supplies the test signal via the first test point to the first or second line, and
- a first receiver having
  - a second test point for connecting the first or second line and
  - a receiver front end, which receives an incoming signal from the first or second line via the second test point, and
- an evaluation logic, which is connected to the receiver front end and which compares an input signal to a threshold value in order to identify an intermittent impedance variation in the first and/or second line,
- wherein the test signal generator comprises an identification signal generator, which generates a unique identification signal, a mixer and an oscillator, wherein the mixer mixes the identification signal with a carrier signal generated by the oscillator to form an in particular BPSK-modulated high frequency signal.

* * * * *